United States Patent
Magdassi et al.

(10) Patent No.: US 9,107,275 B2
(45) Date of Patent: Aug. 11, 2015

(54) TRANSPARENT CONDUCTIVE COATINGS FOR OPTOELECTRONIC AND ELECTRONIC DEVICES

(75) Inventors: Shlomo Magdassi, Jerusalem (IL); Michael Grouchko, Jerusalem (IL); Michael Layani, Jerusalem (IL)

(73) Assignee: YISSUM RESEARCH DEVELOPMENT COMPANY OF THE HEBREW UNIVERSITY OF JERUSALEM LTD., Jerusalem (IL)

(*) Notice: Subject to any disclaimer, the term of this patent is extended or adjusted under 35 U.S.C. 154(b) by 525 days.

(21) Appl. No.: 13/503,772

(22) PCT Filed: Nov. 2, 2010

(86) PCT No.: PCT/IL2010/000909
§ 371 (c)(1),
(2), (4) Date: Apr. 24, 2012

(87) PCT Pub. No.: WO2011/051952
PCT Pub. Date: May 5, 2011

(65) Prior Publication Data
US 2012/0204950 A1    Aug. 16, 2012

Related U.S. Application Data

(60) Provisional application No. 61/257,139, filed on Nov. 2, 2009.

(51) Int. Cl.
*H01L 31/0224*    (2006.01)
*H05B 33/28*    (2006.01)
(Continued)

(52) U.S. Cl.
CPC *H05B 33/28* (2013.01); *C23C 4/18* (2013.01); *C23C 26/00* (2013.01); *H01L 31/1884* (2013.01); *B05D 3/107* (2013.01); *B05D 5/061* (2013.01); *B05D 5/12* (2013.01); *C23C 16/513* (2013.01); *H01L 33/42* (2013.01); *H01L 2924/0002* (2013.01); *H01L 2933/0016* (2013.01); *Y02E 10/50* (2013.01); *Y10T 428/24273* (2015.01); *Y10T 428/24331* (2015.01)

(58) Field of Classification Search
CPC .................................................. C23C 16/513
USPC ............................ 136/256; 313/504; 438/99; 257/E51.019
See application file for complete search history.

(56) References Cited

U.S. PATENT DOCUMENTS 6,197,418 B1    3/2001    Cloots et al.
7,601,406 B2    10/2009    Garbar et al.
(Continued)

FOREIGN PATENT DOCUMENTS

JP    A-2008-130449    6/2008
WO    WO 2006/072959 A1    7/2006
WO    WO 2009/017852 A2    2/2009

OTHER PUBLICATIONS

Wu et al., "Transparent, Conductive Carbon Nanotube Films," *Science*, vol. 305, pp. 1273-1276, Aug. 27, 2004.
(Continued)

*Primary Examiner* — Jayne Mershon
(74) *Attorney, Agent, or Firm* — Oliff PLC

(57) ABSTRACT

The invention provides processes for the manufacture of conductive transparent films and electronic or optoelectronic devices comprising same.

8 Claims, 11 Drawing Sheets

(51) Int. Cl.
*C23C 4/18* (2006.01)
*C23C 26/00* (2006.01)
*H01L 31/18* (2006.01)
C23C 16/513 (2006.01)
B05D 3/10 (2006.01)
B05D 5/06 (2006.01)
B05D 5/12 (2006.01)
H01L 33/42 (2010.01)

(56) References Cited

U.S. PATENT DOCUMENTS

| | | | |
|---|---|---|---|
| 2003/0180511 A1 | 9/2003 | Yukinobu et al. | |
| 2007/0003743 A1 | 1/2007 | Asano et al. | |
| 2008/0129193 A1* | 6/2008 | Asabe et al. | 313/504 |
| 2008/0284313 A1 | 11/2008 | Berben et al. | |
| 2009/0214766 A1 | 8/2009 | Magdassi et al. | |

OTHER PUBLICATIONS

Jiang et al., "Aluminum-doped zinc oxide films as transparent conductive electrode for organic light-emitting devices," *Applied Physics Letters,* vol. 83, No. 9, pp. 1875-1877, Sep. 1, 2003.
Wang et al., "Transparent, Conductive Graphene Electrodes for Dye-Sensitized Solar Cells," *Nano Letters,* vol. 8, No. 1, pp. 323-327, 2008.
Deegan et al., "Capillary flow as the cause of ring stains from dried liquid drops," *Letters to Nature,* vol. 389, pp. 827-829, Oct. 23, 1997.
Hu et al., "Marangoni Effect Reverses Coffee-Ring Depositions," *The Journal of Physical Chemistry B Letters,* vol. 110, No. 14, pp. 7090-7094, 2006.
Sommer et al., "Formation of Crystalline Ring Patterns on Extremely Hydrophobic Supersmooth Substrates: Extension of Ring Formation Paradigms," *Crystal Growth & Design,* vol. 5, No. 2, pp. 551-557, 2005.
Perelaer et al., "The preferential deposition of silica micro particles at the boundary of inkjet printed droplets," *Soft Matter,* vol. 4, pp. 1072-1078, 2008.
Kamyshny et al., "Ink-Jet Printing of Metallic Nanoparticles and Microemulsions," *Macromolecular Rapid Communications,* vol. 26, pp. 281-288, 2005.
Perelaer et al., "Droplet Tailoring Using Evaporative Inkjet Printing," *Macromolecular Chemistry and Physics,* vol. 210, pp. 387-393, 2009.
Soltman et al., "Inkjet-Printed Line Morphologies and Temperature Control of the Coffee Ring Effect," *Langmuir,* vol. 24, pp. 2224-2231, 2008.
Van Den Berg et al., "Geometric control of inkjet printed features using a gelating polymer," *Journal of Materials Chemistry,* vol. 17, pp. 677-683, 2007.
Magdassi et al., "Ring Stain Effect at Room Temperature in Silver Nanoparticles Yields High Electrical Conductivity," *Langmuir,* vol. 21, No. 23, pp. 10264-10267, 2005.
Magdassi et al., "Conductive Ink-Jet Inks for Plastic Electronics: Air Stable Copper Nanoparticles and Room Temperature Sintering," *Society for Imaging Science and Technology,* Abstract Only, 2009.
May 4, 2011 International Search Report issued in International Patent Application No. PCT/IL2010/000909.

* cited by examiner

TRANSPARENT CONDUCTIVE COATINGS FOR OPTOELECTRONIC AND ELECTRONIC DEVICES

FIELD OF THE INVENTION

The present invention generally relates to a method for producing conductive transparent films and to optoelectronic and electronic devices comprising them.

BACKGROUND OF THE INVENTION

Transparent conductive coatings are used in a wide range of applications such as displays (LCD, Plasma, touch screens, e-paper, etc), lighting devices (electroluminescence, OLED) and solar cells. The markets of these applications are moving towards flexible and printable products ("plastic electronics"), for which the current technology based on transparent conductive oxide (TCO) has numerous disadvantages having to do with, e.g., complexity of the manufacturing process, high cost, abundance of precursors, and relatively low conductivity. Consequently, much effort is devoted to finding alternatives for the most widely used tin doped indium oxide, ITO, which would provide high conductivity and yet high transparency.

Alternatives to obtaining transparent conductive coatings have been disclosed. Wu et al [1] demonstrated the application of carbon nanotubes as transparent electrodes, exhibiting transmittance properties in the IR range that are superior to ITO. Jiang et al [2] employed Al-doped ZnO films for OLED devices, and Wang et al [3] used ultra thin graphene films for solar cells.

Another alternative consists of a grid pattern, such as silver wire grids. However, even such an arrangement has several drawbacks, such as limitations in the printing process (resolution, substrate thickness). Garbar et al disclose formation of a transparent conductive coating by the use of emulsions [4].

Deegan et al found that once a millimeter-size droplet of liquid containing solid particles is pinned to a substrate, upon drying of the droplet, the solid particles assemble into a ring [5]. Hu and Larson demonstrated that in the case of a mixture of liquids the Marangoni affect is also very significant [6]. Sommer [7] suggested a model for analyzing the five forces that affect the particles within the droplets and concluded that the main forces responsible for the ring formation are the interactions between the particles and the substrate and the flux that takes the particles to the periphery. Perelaer at al [8] and Kamyshny et al [9] showed that micrometric individual rings could be obtained by inkjet printing of dispersions of silica particles or microemulsion droplets.

It should be emphasized that in industrial inkjet printing usually a uniform pattern is required, and the "coffee ring effect" is an undesirable phenomenon [11,12].

It was previously reported that the deposition of one ring on top of another lead to the destruction of the first ring due to its re-dispersion [5]. Perelear et al utilized the inkjet printing method within the same printing parameters and obtained uniform size of droplets and consequently uniform rings [10]. Magdassi et al have disclosed [13,14] that in the case of dispersions of silver nanoparticles, this effect can lead to the formation of conductive layers of millimeter size rings without the need for sintering at high temperatures due to spontaneous close packing of the silver nanoparticles at the rim of the ring.

REFERENCES

[1] Z. C. Wu, Z. Chen, X. Du, J. M. Logan, J. Sippel, M. Nikolou, K. Kamaras, J. R. Reynolds, D. B. Tanner, A. F. Hebard, and A. G. Rinzler, Science 2004, 305, 1273-1276.
[2] X. Jiang, F. L. Wong, M. K. Fung, and S. T. Lee, Applied Physics Letters 2003, 83, 1875-1877.
[3] X. Wang, L. J. Zhi, and K. Mullen, Nano Letters 2008, 8, 323-327.
[4] A. Garber, F. De La Vega, E. Matzner, C. Sokolinsky, V. Rosenband, A. Kiselev, D. Lekhtman, U.S. Pat. No. 7,601,406 (B2)
[5] R. D. Deegan, O. Bakajin, T. F. Dupont, G. Huber, S. R. Nagel, T. A. Witten, Nature 1997, 389, 827-829.
[6] H. Hu, R. G. Larson, J. Phys Chem B 2006, 110, 7090-4.
[7] A. P. Sommer, N. Rozlosnik, Crystal Growth & Design 2005, 5, 551-557.
[8] J. Perelear, P. J. Smith, C. E. Hendriks, A. M. J. van der Berg, U. S. Schubert, Soft Matter 2008, 4, 1072-1078.
[9] A. Kamyshny, M. Ben-Moshe, S. Aviezer, S. Magdassi, Molecular Rapid Communications 2005, 26, 281-288.
[10] J. Perelear, P. J. Smith, M. M. P. Wijnen, E. van den Bosch, R. Eckardt, P. H. J. M. Ketelaars, U.S. Schubert, Molecular Chemistry and Physics 2009, 210, 387-393.
[11] D. Soltman, V. Subramanian, Langmuir 2008, 24, 224-2233.
[12] A. M. J. van der Berg, A. W. M. de Laat, P. J. Smith, J. Perelear, U. S. Schubert, Journal of Materials Chemistry 2007, 17, 677-683.
[13] S. Magdassi, M. Grouchko, D. Toker, A. Kamyshny, A. Balberg, O. Millo, Langmuir 2005, 21, 10264-10267.
[14] S. Magdassi, A. Kamyshny, S. Aviezer, M. Grouchko, US2009/0214766.
[15] S. Magdassi, M. G. Grouchko, A. Kamyshny, Digital fabrication 2009.

SUMMARY OF THE INVENTION

The present invention is aimed to provide improved processes for producing conductive transparent films and devices which incorporate such films, such as solar cells. The transparent conductive films of the present invention are generally characterized by an array of ring structures, which, in some embodiments of the invention, are spaced-apart material-free voids (or holes) in a continuum of a conductive material surface, and in others are intersecting conductive rings constructed of a conductive material on a non-conductive surface. The films of the invention are thus characterized by an array of conductive lines composed of conducting materials surrounding empty two dimensional material-voids, as further disclosed hereinbelow.

Thus, in one aspect of the invention, there is provided a process for the manufacture of a conductive transparent film on a substrate, the process comprising:

coating a substrate by a first material to form a wet film of said first material on at least a region of a surface of said substrate;

treating the wet film with at least one second material capable of displacing the first material in the film at the point of contact; thereby leading to displacement of the film material from the point of contact and exposure of the substrate, to provide an array of spaced apart material-free voids in said film; and optionally treating the film to render the first material conductive.

In some embodiments, wherein said first material is an electrically conductive material, the process comprises:

coating a substrate by a conductive material to form a conductive film on at least a region of surface of said substrate;

treating the conductive film with at least one material (being different from the conductive material) capable of displacing the conductive material in the conductive film at the point of contact; thereby leading to displacement of the film material from the point of contact and the exposure of the substrate, to provide an array of spaced apart material-free voids in said film.

As used herein, the "material-free voids" are empty cells, openings, in the film of the first or conductive material, through which the substrate is exposed. The voids are separated by a conductive material which forms a continuous pattern. The conductive material is substantially a network of thin lines between the material-free voids. In the conductive transparent film, the voids are substantially free of the first or conductive material. The voids are further characterized hereinbelow.

The conductive transparent film (the first material in the above aspect of the invention) is produced on a "substrate" which may be a flexible or rigid substrate, which may be substantially two-dimensional (a thin flat substrate) or a three-dimensional curved (non-flat) surface. The substrate can be of any smoothness. In most general terms, the substrate may be of a solid material such as glass, paper, a semiconductor inorganic or organic, a polymeric material or a ceramic surface. The surface material, being the substrate on which the film (of the first material or conductive material) is formed, may not necessarily be of the same material as the bulk of the object on the surface of which the film is produced.

In some embodiments, the substrate is an inorganic semiconductor material, including but not limited to, silicon, tin, compounds of boron, tellurium, geranium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

Alternatively, the substrate may be of a polymeric material such as a polyamide, polyester, a polyacrylate, a polyolefin, a polyimide, a polycarbonate and polymethyl methacrylate.

In accordance with the present invention, the substrate is coated on at least a region of its surface by a first material which may be conductive or rendered conductive by any one method, thereby obtaining a conductive film or pattern on the at least a region of the substrate surface. In the context of the invention, the conductivity (or resistance) and transparency of the film is measured within the boundaries of the coated at least a region of the substrate.

The at least a region of the surface may be the complete surface of the substrate or one or more regions of the substrate which may be connected to each other or in the vicinity of the other or spaced apart. The regions need not be of any predetermined size or shape. The regions may be in the form of a desired predetermined pattern.

The first material, e.g., conductive or precursor thereof, may be applied to the substrate by any means available so as to form a film of a desired thickness. The material may be applied by ink jetting by an ink-jet printer, by spraying by a sprayer or any other method such as air brush, by brushing the surface, by dipping the substrate into a liquid carrier comprising the, e.g., conductive material, by the doctor blade method, spin and roll-to-roll coating or by any other means as known in the art.

Where ink jetting techniques are employed, the material droplets may be in the range of 1 picoliter to 10 microliter.

The first material or the conductive material is typically selected from a metal, a transition metal, a semiconductor, an alloy, an intermetallic material, a conducting polymer, a carbon based material such as carbon black, carbon nanotubes (CNT), graphite, graphene, fullerenes, and carbon allotropes. Depending on the particular application, the conductive material may be a combination of two or more different materials which are deposited on the substrate as a mixture to form, or step-wise. In some embodiments, the two or more different conductive materials are deposited on the substrate to form a plurality of ring structures, each ring structure being of a different conductive material as defined above. In other embodiments, the two or more different conductive materials are deposited step-wise to form a conductive multilayer, each layer (film) being composed of a plurality of ring structures and being of a different material or material form. Where two or more materials are employed in the formation of a single conductive film, they may be present in equal amounts or at any ratio, or where one of the materials is used as a dopant of the other.

In some embodiments, the conductive material is or comprises an element of Groups IIIB, IVB, VB, VIB, VIIB, VIIIB, IB, IIB, IIIA, IVA and VA of block d of the Periodic Table of the Elements.

In other embodiments, the conductive material is or comprises a transition metal selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg.

In other embodiments, the conductive material is selected, in a non-limiting fashion, from indium(III) acetate, indium (III) chloride, indium(III) nitrate, indium(III) acetylacetonate, for the creation of $CuInS_2$ and $Cu(InGa)S_2$; iron(II) chloride, iron(III) chloride, iron(II) acetate, iron(III) acetylacetonate for the formation of $CuFeS_2$; gallium(III) acetylacetonate, gallium(II) chloride, gallium(III) chloride, gallium(III) nitrate for the formation of $CuGaS_2$ and $Cu(InGa)S_2$; aluminum(III) chloride, aluminum(III) stearate for the formation of $CuAlS_2$; silver nitrate, silver chloride for the formation of AgS; dimethlyzinc, diethylzinc, zinc chloride, tin(II) chloride, tin(IV) chloride, tin(II) acetylacetonate, tin (II) acetate for the formation of $Cu_2(ZnSn)S_4$; cadmium(II) chloride, cadmium(II) nitrate, cadmium(II) acetate, cadmium (II) acetylacetonate, cadmium(II) stearate for CdS; lead(II) acetate, lead(II) acetylacetonate, lead(II) chloride, lead(II) nitrate and PbS.

In other embodiments, the conductive material is selected amongst semiconductor materials. The semiconductor material may be selected from elements of Group II-VI, Group III-V, Group IV-VI, Group Group IV semiconductors and combinations thereof.

In some embodiments, the semiconductor material is a Group II-VI material being selected from CdSe, CdS, CdTe, ZnSe, ZnS, ZnTe, HgS, HgSe, HgTe, CdZnSe and any combination thereof.

In other embodiments, Group III-V material are selected from InAs, InP, InN, GaN, InSb, InAsP, InGaAs, GaAs, GaP, GaSb, AlP, AlN, AlAs, AlSb, CdSeTe, ZnCdSe and any combination thereof.

In additional embodiments, the semiconductor material is selected from Group IV-VI, the material being selected from PbSe, PbTe, PbS, PbSnTe, $Tl_2SnTe_5$ and any combination thereof.

In further embodiments, the conductive material is selected amongst metal alloys and intermetallics of the above metal and/or transition metals. Non-limiting examples of such alloys are WMo, MoRh, $MoRh_3$, $Rh_{0.34}Ru_{0.66}$, $Rh_{0.4}Ru_{0.6}$, PdRh, PdRu, $MoPd_2$, $Pd_{0.3}Mo_{0.8}$, MoPt, $Mo_2Pt$, PtPd, $Pt_{0.4}Ru_{0.6}$; $Pt_{0.2}Ru_{0.8}$, PtRh, WPt, AuPd, AuPt, AuRh, AuRu, AuMo, and AuW.

In additional embodiments, the conductive material is a carbon based material such as carbon black, carbon nanotubes (CNT), graphite, graphene, fullerenes, or other carbon allotropes.

The conductive material may alternatively be a conductive polymer such as poly(3,4-dioctyloxythiophene) (PDOT), poly(3,4-ethylenedioxythiophene):poly(styrenesulfonate) (PDOT:PSS), polyaniline and polypyrrole.

In other embodiment of the invention, the conductive film is obtained by treating the substrate with a first material which is electrically non-conductive at the deposition step, but can be made conductive after further treatment (e.g., heating). The post-treatment for rendering the non-conductive material conductive include, in a non-limiting fashion, heating, chemical treatment, plasma, UV, laser, or microwave irradiation, flash lamp (Xenon) electroless plating, further coating and others.

For example, a non-conductive material, such as a silver precursor, may be deposited on the substrate and may be rendered conductive, subsequent to hole printing by, e.g., heating.

In other embodiments, the conductive material is in the form of particles, e.g., nanoparticles.

The conductive material is typically dispersed or dissolved in a liquid carrier prior to application for ease of accurate delivery. The liquid carrier may be selected from water and organic solvents.

The liquid carrier may comprise at least one additional material for endowing specific functionality or enhancing the any one property of the film, such functionalities or property may be wetting, rheology, adhesion, doping, scratch resistance, contact and sheet resistance or preferential diffusion into an adjacent layer. Such materials may include glass frits and inorganic salts. In some embodiments, glass frits may be added to the conductive formulation prior to application to aid inter-diffusion and adhesion with a silicon-based semiconductor layer as known in silicon based photovoltaic cells.

Once a film of a conducting material (the first material) is formed on the substrate, the conductive film is treated with at least one second material which is capable of displacing the conductive material in the film upon contact, at the so-called point of contact, clearing a void, hole or a cell in the conductive layer. The at least one second material differs from the first material of the conductive film by at least one chemical or physical parameter which permits the eventual displacement of material from the conductive film. Such parameter may be of the material itself or of the solution (solvent) in which it is dispersed, dissolved or otherwise carried; the parameter being selected from hydrophilicity, hydrophobicity, wetting behavior, surface tension and surface energy, spreading coefficient, evaporation rate, viscosity and other parameters. The at least one second material, e.g., liquid, can be deposited on the film at various stages of evaporation of the wet film, as long as the displacement process is enabled.

For example, in some embodiments, the first material is a hydrophobic solvent with conductive material in the form of nanoparticles and the at least one second material deposited as individual droplets on top of the film of the conductive material is carried in an aqueous medium. Due to the difference between the two materials, the aqueous material spreads over the wet film of nanoparticles, and due to surface energy effects come into contact with the substrate, thus forming material-free voids in the form of rings or holes, while pushing the nanoparticles to the rim of the material droplets. This eventually results, in this example, in narrow lines composed of closely packed nanoparticles and empty two dimensional voids. The dimensions of the material voids may be controlled by the size of the aqueous droplets, the competitive wetting of the droplets and the wet dispersion conductive film, the kinetics of the spreading, evaporation and particle-particle interactions.

Thus, in some embodiments, the conductive film is a solvent-based (non-aqueous) material containing metallic nanoparticles.

In order to maintain high conductivity and achieve transparency in the film, the density of the voids (holes, cells) in the conductive layer should be such that the width between the voids of the remaining conductive material is less than 50 microns (between 1 and 50 microns) and in some cases at most 20 microns (between 1 and 20 microns). Notwithstanding, it should be noted that the final conductivity of the transparent film may also depend on several other parameters and the final coating may therefore, in certain embodiments, require additional processing to achieve high conductivity/transparency. Such processing may be heating, plasma, UV, laser, or microwave irradiation, flash lamp (Xenon) electroless plating, further coating and others.

Typically, the height of the void rims is less than 10 microns and the average void diameter is less than 500 microns. In some embodiments, the void diameter is between 10 and 300 microns, e.g., about 200 microns depending on the equipment used for deposition of the droplets.

Small network cell size is preferred for low resistance losses in photovoltaic devices utilizing highly resistive materials (e.g. amorphous silicon or organic cells). In such devices, the resistance associated with lateral motion of charge carriers from the middle of the void that is generally no larger than the resistance associated with vertical motion of the carriers within the semiconductor layer, i.e., the path length for moving carriers for a small network cell is no longer horizontally than vertically. Larger network void diameters could generate substantially greater ohmic losses and are thus generally not preferred.

The film having the material-free void pattern has a sheet resistance (if composed of nanoparticles, as measured after sintering) of between 0.004 Ohm/square to 5 kOhm/square, in some cases less than 50 ohm/sq, less than 20 ohm/sq, less than or equal to 7 ohm/sq. The exhibited sheet resistance may be attributed to a close packing of the conductive material forming the conductive pattern, but may also be attributed to a post jetting sintering process, as further disclosed below. Sheet resistance may be further reduced by subsequent electroplating of the deposited pattern.

The transparent conductive films of the invention are particularly useful in devices that require transmission of visible, NIR, IR, and/or UV regions of the electromagnetic spectrum. The light transparency of the layers is of at least 30%, in some embodiments at least 50%, in other embodiments at least 70% and in further embodiments of about 95% and more light transparency.

For applications requiring transmission of visible light, transmission is measured in the wavelength range of 400 nm to 700 nm.

In some embodiments, the films manufactured in accordance with the present invention are characterized by a transparency of 95% and a sheet resistance of between 0.004 Ohm/square to 5 kOhm/square.

In some embodiments, the resistivity of the film is 4±0.5 Ohm/square over 0.5 cm$^2$.

Thus, the invention further provides a substrate, as defined herein, coated with a conductive transparent film of a material having a plurality of spaced-apart ring-voids, the rim of each of said plurality of spaced-apart voids is less than 10 microns and the average void-diameter is less than 500 microns.

In some embodiments, the average void diameter is between 10 and 300 microns. In other embodiments, the average void diameter is between about 200 and 300 microns. The width of the conductive material between the voids is smaller than 60 micron The conductive transparent film is further characterized by having at least one attribute selected from:
1. a void spacing of less than 50 microns; in some embodiments, at most 20 microns.
2. a sheet resistance of between 0.004 Ohm/square and 5 kOhm/square; in some embodiments, less than 50 ohm/sq; in further embodiments, less than 20 ohm/sq; in still other embodiments, less than or equal to 7 ohm/sq., and
3. a light transparency of at least 30%; in some embodiments, at least 50%; in other embodiments, at least 70% and in further embodiments of at least 95% transparency.

In some embodiments, the conductive transparent film is characterized by a light transparency of 95% and a sheet resistance of between 0.004 Ohm/square to 5 kOhm/square.

In other embodiments, the resistivity of the conductive transparent film is 4±0.5 Ohm/square over 0.5 cm$^2$.

The invention also provides a substrate, as defined herein, coated with a conductive transparent film of a material having a plurality of spaced-apart voids, the rim of each of said plurality of spaced-apart voids is less than 10 microns and the average hole-diameter is less than 500 microns, wherein the film has an overall transparency of 95% and a sheet resistance of between 0.004 Ohm/square to 5 kOhm/square.

The invention also provide a conductive transparent film of a material, said film having a plurality of spaced-apart material voids, the rim of each of said plurality of spaced-apart voids is less than 10 microns and the average hole-diameter is less than 500 microns, wherein the film has an overall transparency of 95% and a sheet resistance of between 0.004 Ohm/square to 5 kOhm/square.

A conductive transparent film according to the above aspect of the invention is shown in FIG. 1. The film was prepared by inkjet printing of drops of a single aqueous solution (the second material) on a wet film of solvent-based silver dispersion (the first material). The application of the aqueous droplets onto the silver film caused a replacement of the silver solvent dispersion/substrate interface with the aqueous solution/substrate interface, resulting in empty cells, material-free voids. The silver particles, which were displaced to the rim of the droplet formed a darker area, typical for more condensed packing of the particles. Similarly, spraying an aqueous solution containing a wetting agent onto a wet film of a solvent-based dispersion of silver particles, demonstrated similar results. In this example, the averaged diameter of the material-voids, in the specific example, was measured at approximately 238 micrometer.

In another aspect of the present invention, there is provided a process for the manufacture of a conductive transparent pattern on a substrate, the process comprising treating a substrate with a plurality of droplets of a conductive material, permitting said droplets to form an array of intersecting ring-structures on the substrate, wherein the conductive material is selected from (1) a combination of two or more metals or precursors thereof, (2) a semiconductor material, (3) a carbon based material such as carbon black, carbon nanotubes (CNT), and other carbon allotropes, (4) quantum dots, and (5) any mixture of the aforementioned, to thereby obtain a conductive transparent pattern on the substrate.

In accordance with this aspect of the invention, the conductive transparent coating is obtained by self-assembly of a conductive material. The self-assembly permits the formation of arrays of interconnected micrometric rings. The rim of each ring has a width of between 1-10 microns (in some embodiments, 1-5 microns, in other embodiments, 2-9 microns, in further embodiments, 3-9 microns, or 2-6 microns) and is composed of closely packed nanoparticles. Such an arrangement results in high electrical conductivity. The center of each ring is actually a hole, having a diameter of between about 100 and 200 microns. Due to the small dimensions, the whole array of the interconnected rings is optically transparent and maintains its high conductivity.

The conductive arrays may be obtained by inkjet printing of picoliter droplets of a dispersion of at least one conductive material, as defined hereinabove, e.g., silver, onto a substrate, as defined hereinabove. After printing, each printed dot is self-assembled into a ring, by the well known "coffee ring effect". This effect may be utilized, in accordance with the invention, for obtaining a functional property, namely transparency and conductivity, by forming tow-dimensional arrays of interconnected conductive rings. The fabrication of the arrays is spontaneous, with a low cost process of inkjet printing. The resulting conductivity and transparency of these are comparable to that of ITO.

As stated above in reference to conductive materials, two or more such materials may be used for improving one or more properties of the array. By employing dispersions containing a mixture of two or more conductive nanoparticles, segregation (FIG. 2) can be obtained. The two nanoparticle-populations may differ by size, protective molecule, dispersant or coating.

The invention thus provides a substrate, as defined hereinabove, coated with a conductive transparent film, the film having a pattern of intersecting ring structures of a conductive material selected from (1) a combination of two or more metals or precursors thereof, (2) a semiconductor material, (3) carbon based materials such as carbon black, carbon nanotubes (CNT), and other carbon allotropes, (4) quantum dots, and (5) any mixture of the aforementioned, the rim of each ring structure has a width of between about 1-5 microns, the diameter of each ring structure is between about 100 and 200 micrometer.

The film is further characterized by at least one parameter selected from:
1. a sheet resistance of between 0.004 Ohm/square and 5 kOhm/square; and
2. a light transparency of at least 30%; in some embodiments, at least 50%; in other embodiments, at least 70% and in further embodiments of at least 95% transparency.

The present invention provides in a further of its aspects, a device implementing at least one conductive transparent film according to the present invention.

In some embodiments, the conductive transparent film having a plurality of spaced-apart ring-voids, the rim of each of said plurality of spaced-apart voids is less than 10 microns and the average void-diameter is less than 500 microns.

In some embodiments, the average void diameter in the film is between 10 and 300 microns. In other embodiments, the average void diameter in the film is between about 200 and 300 microns. The width of the conductive material between the voids is smaller than 60 micron In further embodiments, the film implemented in the device of the invention is further characterized by having at least one attribute selected from:
1. a void spacing of less than 50 microns; in some embodiments, at most 20 microns.
2. a sheet resistance of between 0.004 Ohm/square and 5 kOhm/square; in some embodiments, less than 50 ohm/ sq; in further embodiments, less than 20 ohm/sq; in still other embodiments, less than or equal to 7 ohm/sq., and 3. a light transparency of at least 30%; in some embodiments, at least 50%; in other embodiments, at least 70% and in further embodiments of at least 95% transparency.

In some embodiments, the conductive transparent film implemented in the device is characterized by a light transparency of 95% and a sheet resistance of between 0.004 Ohm/square to 5 kOhm/square.

In other embodiments, the resistivity of the conductive transparent film is 4±0.5 Ohm/square over 0.5 cm$^2$.

The invention also provides a device implementing a conductive transparent film having a plurality of spaced-apart voids, the rim of each of said plurality of spaced-apart voids is less than 10 microns and the average hole-diameter is less than 500 microns, wherein the film has an overall transparency of 95% and a sheet resistance of between 0.004 Ohm/square to 5 kOhm/square.

The invention also provides a device implementing a conductive transparent film having a pattern of intersecting ring structures of at least one conductive material.

In some embodiments, the conductive material is as defined hereinabove.

In other embodiments, the conductive material is non-metallic.

In other embodiments, the conductive material is selected from (1) a combination of two or more metals or precursors thereof, (2) a semiconductor material, (3) carbon based materials such as carbon black, carbon nanotubes (CNT), and other carbon allotropes, (4) quantum dots, and (5) any mixture of the aforementioned.

In further embodiments, the conductive transparent film implemented in the device, the rim of each of said ring structures has a width of between about 1-5 microns, the diameter of each ring structure is between about 100 and 200 micrometer.

The conductive transparent film is further characterized by at least one parameter selected from:

1. a sheet resistance of between 0.004 Ohm/square and 5 kOhm/square; and
2. a light transparency of at least 30%; in some embodiments, at least 50%; in other embodiments, at least 70% and in further embodiments of at least 95% transparency.

In some embodiments, the conductive transparent film is constructed of at least two intersecting ring structures or at least two layered films of intersecting ring structures, wherein the ring structures are composed of different conductive materials, as defined hereinabove. In some embodiments, the at least two intersecting ring structures are composed of two or more different conductive materials. In further embodiments, the at least two layers of intersecting ring structures are constructed of layered films of ring structures, each film being of a different conductive material or composed of ring structures of different conductive materials.

In some embodiments, the layer implemented in the device of the invention is manufactured according to the process comprising:

coating a substrate by a first material to form a wet film of said first material on at least a region of a surface of said substrate;

treating the film with at least one second material capable of displacing the first material in the film at the point of contact; and optionally treating the film to render the first material conductive.

In some embodiments, wherein said first material is a conductive material, the layer in the device is manufactured according to the process comprising:

coating a substrate by a conductive material to form a conductive film on at least a region of surface of said substrate;

treating the conductive film with at least one material (being different from the conductive material) capable of displacing the conductive material in the conductive film at the point of contact. In some other embodiments, the layer implemented in the device of the invention is manufactured according to the process comprising treating a substrate with a plurality of droplets of a conductive material, permitting said droplets to form an array of material ring-structures on the substrate, wherein the conductive material is selected from (1) a combination of two or more metals or precursors thereof, (2) a semiconductor material, (3) carbon based materials such as carbon black, carbon nanotubes (CNT), and other carbon allotropes, (4) quantum dots, and (5) any mixture of the aforementioned.

The invention also provides a device implementing a conductive transparent multilayer, said multilayer being composed of a plurality of films, each film of said multilayer being composed of a plurality of ring structures. In such devices, each layer may be of a different material or material form or composed of a plurality of ring structures of different materials or material forms.

In the above embodiments, the substrate on which the film is provided may be an integral part of the device or may be a substrate which following its treatment as recited is implemented in the device.

The device may be an electronic device or an optoelectronic device.

In various designs, including dye-sensitized solar cells (DSSCs), an additional layer over the transparent conductive film may be formed by plating. For some applications (e.g., DSSCs), the use of such a protective layer over the metal, e.g., silver, may be useful.

As known, optoelectronics is the study and application of electronic devices that source, detect and control light; such devices may be electrical-to-optical and/or optical-to-electrical transducers. The conductive transparent films produced in accordance with the invention can be employed as conductive transparent electrodes, replacing ITO as the material of choice. The films manufactured according to the invention exhibit higher transparency and thus lead to higher efficiency of the optoelectronic device.

The transparent conductive films of the invention may be integrated in devices, that requires transmittance of visible, UV, IR, and/or NIR regions of the electromagnetic spectrum, including for example, photoconductors, photodiodes; solar cells; light emitting diodes (LEDs), including organic light emitting diodes and lasers; light sensors, as well as specialized transistors, including organic transistors, inorganic transistors, or hybrid transistors. Other applications for utilization of such coatings are related to the following categories: printed electronics, touch screens, display backplanes and large or small area flexible applications. Flexible applications further include large area arrays, flexible displays, and e-paper (electronic books, journals, newspapers).

Additionally, the conductive transparent films may further find utility in monitoring or detection devices for healthcare, security or safety-related uses, including low-cost or disposable sensors or optical devices, as well as in smart packaging such as for incorporation of tags or RFID components into the packaging. In addition, the technology can be employed in building applications such as smart windows, or in specialty coatings and paints which function as part of a semiconductor device.

In some embodiments, the optoelectronic device is photovoltaic solar cells.

The transparent conductive film which is produced according to the processes of the present invention may be integrated as follows:

1. in silicon (monocrystalline or polycrystalline) based solar cells, as a front electrode. In this case a heating step may be required, in the presence or absence of a suitable penetration enhancer such as, and not limiting to, glass frits.

2. as the transparent electrode under other thin films. The thin films may consist semiconductor material that is deposited by means such as CVD (chemical vapor deposition), PVD (pressure vapor deposition), electroplating and ultrasonic nozzles on top of the array of rings suggested here. The most common materials deposited by such a method are CdTe, CIGS (cupper Indium Galium Sellenide), amorphus silicone and micromorphus silicon.

3. in organic solar cells, as the transparent electrode. In these devices the organic semiconductors (such as copper phthalocyanine, carbon fullerens and others), are sandwiched between the transparent conductive film, for example obtained in accordance with the invention, and the bottom electrode (e.g. Mg, Ca and Al).

4. as the electrode in dye-sensitized solar cells (DSSC), that permits the photons to pass through to the dye and create an exited state. In this type of cells the front and back parts are then joined and sealed together to prevent the electrolyte from leaking and the interconnected ring can serve as the transparent electrode from both sides.

The transparent electrode composed of conductive rings or conductive patterns connecting the holes and produced by the present invention may also have a lower resistivity than ITO while maintaining light transmittance. Lower resistivity can lead to lower power losses, for example, in conversion of optical power to electrical power in solar cells. Further, the geometry of the ring pattern of the transparent electrode is advantageous over the geometry of a conventional silver grid due to higher transparency. The line width of screen-printed grids is typically quite large (100 microns) in comparison to the line width of the rings forming the array of the present transparent electrodes (~10 microns). Reduced line widths allow greater transparency.

Further, conventional screen-printed silver electrodes tend to have poor geometries for conductance purposes owing to the fact that the lines of the grid pattern cannot be printed close to each other owing to resolution limits. For example, in the case of solar cells, due to more distantly spaced grid lines, photo generated charge carriers should travel longer distances through higher resistivity regions (and with greater chance of carrier recombination) leading to greater power loss. In thin solar cells there is a great advantage in forming the conductive patterns by a non-contact method as described in some of the embodiments of the invention.

The fabrication methods for transparent electrodes used in the present invention can also be used to form electromagnetic shielding (EMS).

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 3A is a SEM image of a single ring; FIGS. 3B and 3C are zoomed in images of the rim of the ring; and FIG. 3D is a height profile measurement of the ring.

FIG. 5A is a topographic image of the rim. The corresponding current image, acquired at tip bias of 0.5 V, is presented in FIG. 5B. The current range in the cross section of the silver line (FIG. 5C) is 0-40 nA (the saturation current in the measurement was 40 nA).

FIGS. 6B and C are SEM images showing a closer look on the junction between two rings. It is clearly seen that close-packing of the particles is not damaged by the new junction.

DETAILED DESCRIPTION OF EMBODIMENTS

Figure 1:
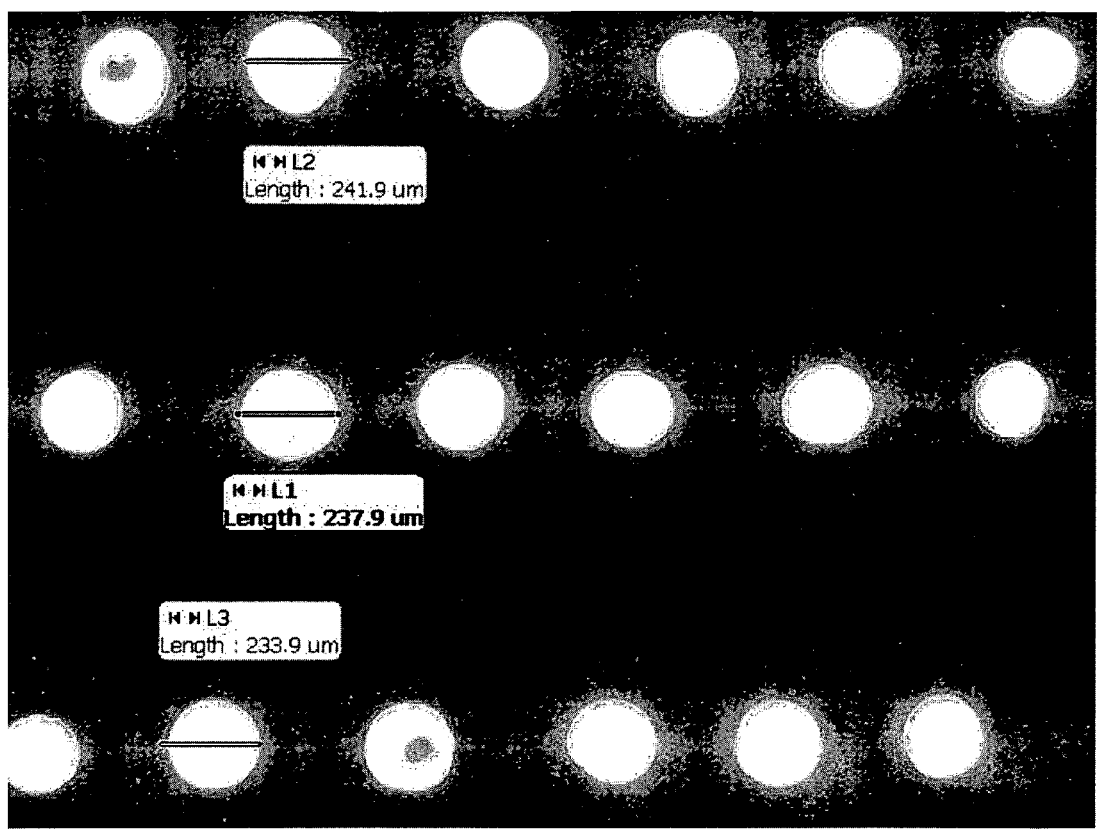
FIG. 1 presents an array of material-free voids (holes) in a film of conductive metallic nanoparticles, the voids are separated by a film of metallic nanoparticles. The voids were obtained by printing an aqueous solution onto a previously formed film of a solvent-based metallic ink.

The transparent conductive patterns provided in accordance with the processes of the present invention are better alternatives to the widely used transparent conductive oxides, such as ITO, and can be utilized in optoelectronic devices such as solar cells. The new transparent conductive coatings are achieved by forming a 2-D array of interconnected rings or array of holes, while the rim of the ring and the spaces in between the holes is composed of a conducting material such as metallic nanoparticles. The rim of the individual rings has a width of below 50 microns and a height below 300 nm, which surrounds a "hole" with a controllable diameter for example diameter of about 150 micron, and therefore the whole array of the interconnected rings is invisible to the naked eye. In case of metallic materials, the rims of the rings are composed of self-assembled, closely packed nanoparticles, which make the individual rings and the resulting array electrically conductive.

The formation of arrays of holes is based on controlled wetting which induces, in case of metallic nanoparticles, their self-assembly into predetermined narrow patterns around two-dimensional empty cells. In case of dissolved conducting polymer, the conducting material concentrates at the rims (in case of ring formation) or in between empty spaces (in case of holes formation).

The performance of the new transparent conductive coatings which are obtained by printing metallic (or semiconductor) particles was demonstrated while using it as the transparent electrode on a plastic electroluminescent device, demonstrating the applicability of this concept in plastics electronics. Such transparent conductive coatings can be used in a wide range of applications such as displays (LCD, Plasma, touch screens, e-paper), lighting devices (electroluminescence, OLED) and solar cells.

Example 1

Printing Holes

A glass slide was coated by a solvent based silver ink (solvent with dispersed silver nanoparticles) by draw down. Before the total evaporation of the solvent, an aqueous solution was printed on top of the coat by ink-jet printing (MicroFab, 60 um wide nozzle). The solution contained 0.05% of a wetting agent (BYK 348) The printed droplets led to the de-wetting of the silver ink at the printing zone, i.e., to the formation of holes (an area which does not contain the conducting material). The area with holes can be further treated if required to obtain conductivity. For example, if the conducting material is silver nanoparticles, the substrate can be sintered at elevated temperature, or by other chemical means.

Example 2

Single Rings

Single rings with a diameter of ~150 micrometer were obtained by ink-jetting a silver ink (prepared as described elsewhere [14]) on polyethylene terphthalate (PET) substrate with the single nozzle print-head.

Silver ink: The aqueous ink contained 0.5 wt % dispersed silver nanoparticles, with a diameter of 5 to 20 nm, stabilized by polyacrylic acid.

The surface tension of the ink was adjusted to 30 mN/m by the use of Byk®348 (BykCheime). The pH was set to 10 using amino methyl propanol.

Printing: The printing of the dispersion was performed by Microfab®JetDrive™ III printer with a 60 micrometer wide single nozzle. The applied waveform for all the printing experiments was: voltage 110 V, rise time 3 microsec, echotime 15 microsec, dwell time 30 microsec fall time 5 microsec. As expected, the voltage increased (from the minimal voltage of 20 V), the droplet size increased as well, thus enlarging the ring diameter. Further increase above 110V, was not tested due to device limitation. The dwell time was also increased in steps of 5 microsec up to a value of 40 microsec (in each change the echo-time was double the value of the dwell time), which also caused the droplet and ring diameter to increase. Changing the dwell time and the voltage did not affect the edge profile, as it remained in a parabolic shape. The movement of the substrate was performed by a DMC-21x3XY table (Galil Motion Control, Inc.).

The substrate temperature was set to 30° C. with a Peltier heater/cooler, and humidity within the printing chamber was 30-40% RH.

Figure 3A:
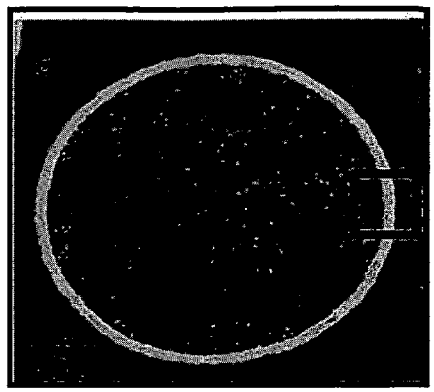
FIGS. 3A-D are SEM images of a ring structure in accordance with the invention.
Figure 3B:
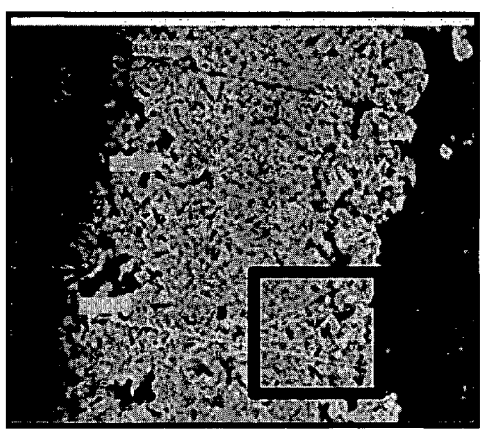
Figure 3C:
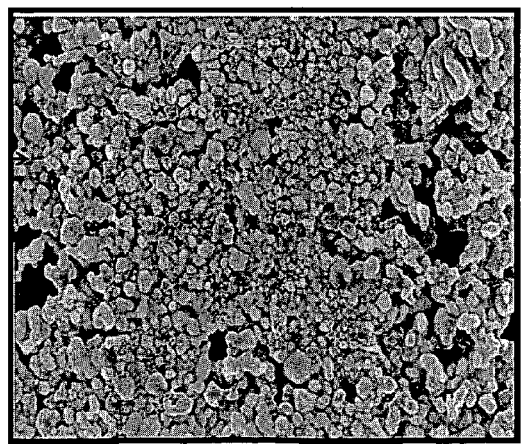
Figure 3D:
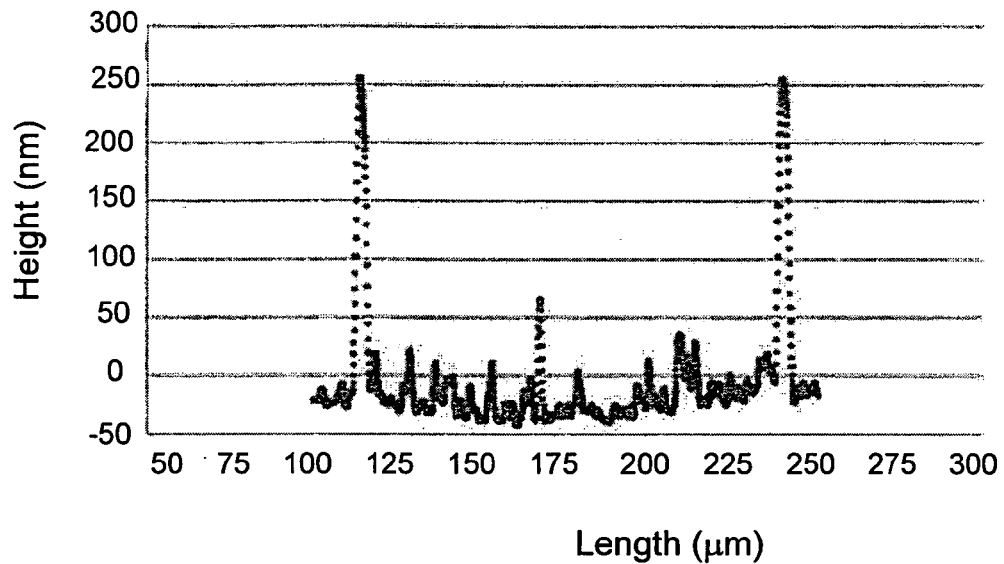
Figure 4:
FIG. 4 presents a SEM image of an array of non-intersecting ring structures.

Preliminary printing tests performed by varying the waveform, surface tension, and metal load of the dispersion indicated that during the evaporation of individual droplets circular rings were formed. As presented in FIG. 3A, the ring diameter is about 150 micrometers, while most of the metallic particles are concentrated at the rim of the ring. SEM evaluation (FIGS. 3B and 3C) shows that the rim is composed of closely packed silver nanoparticles. Profilometer measurement (FIG. 3D) reveals that the height of this layer of nanoparticles is about 250 nm. As shown in FIG. 4, the ring formation process can be repeated for a large number of droplets, while the formed rings are very similar in size and shape.

In order to obtain a conductive array composed of rings, each ring should be conductive. Therefore, at the first stage, resistivity measurements of individual rings were performed by connecting the ring to microelectrodes obtained by vapor deposition of Au/Cr bi-layer through a suitable mask.

In order to achieve low resistivity without heating the plastic substrate, a method that causes close packing of the particles due to surface charge neutralization of the nanoparticles [15] upon exposure to HCl vapors was employed. The resistivity of such individual rings (calculated from the measured resistance and the ring cross-section area and length), was $4.3 (\pm 0.7) \cdot 10^{-7}$ Ohm*m, which is only 7 times greater than that for bulk silver. This value remained constant for at least three months.

Figure 5A:
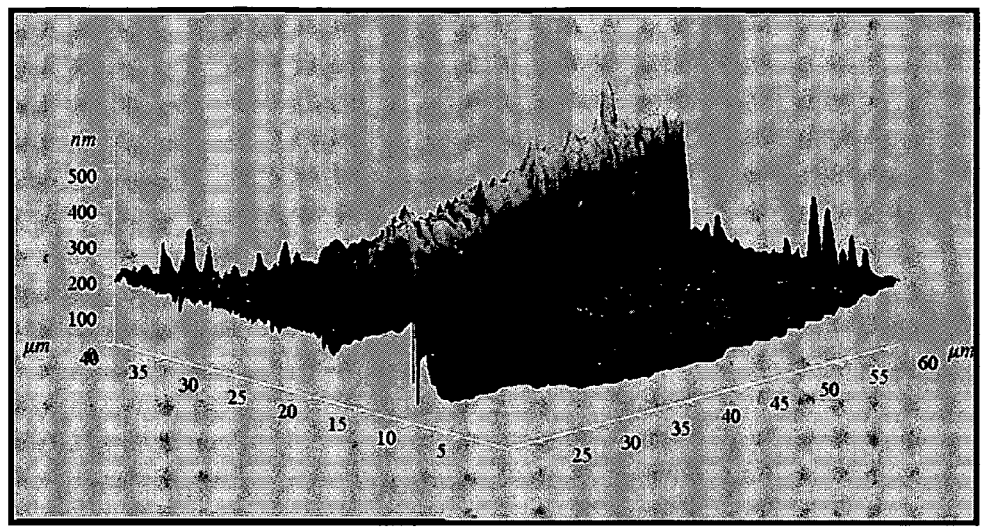
FIGS. 5A-C present a conductive AFM measurement of the rim of a single Ag ring.
Figure 5B:
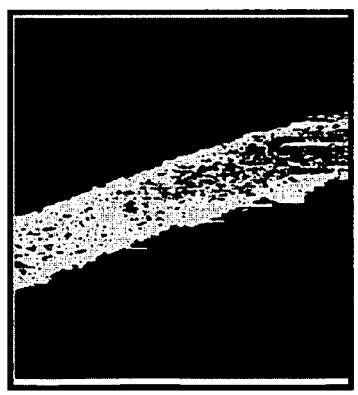
Figure 5C:
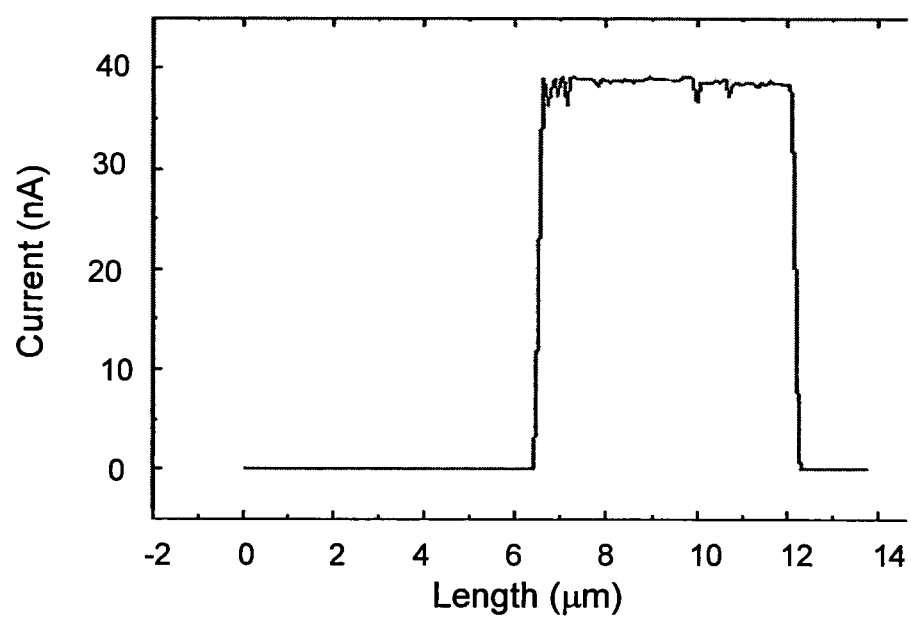

Further insight into the structural conductance properties of the silver ring is provided by the C-AFM data presented in FIGS. 5A-C. The topographic 3-D (FIG. 5A) image shows a continuous line having maximal height of 400 nm and width of about 7 um. The corresponding 2-D current map (FIG. 5C) and image (FIG. 5B) show that the line is indeed conductive. It should be emphasized that even though a small area of the ring is scanned, the fact that this area of the ring is conductive proves electrical continuity over a much larger range, at least as far as the distance to the Au/Cr counter electrode.

Example 3

Rings Composed of Two Different Metals

Two different population of silver and copper NPs were mixed, Ag (~10 nm) and Cu (~100 nm) dispersed in water. A 1 μL droplet of this homogenous dispersion was dispensed on a Si substrate. After the evaporation of the water a single ring with a diameter of ~2 mm was formed. HR-SEM characterization of the ring periphery revealed that the rim is composed of two separate rims (FIG. 2), each rim is consisted mainly of one type of metallic NP; the larger particles (Cu) were at the outer rim while the inner rim consisted mainly of the smaller particles (Ag). Therefore, this approach enables formation of rings composed on different materials.

Example 4

Chains of Connected Rings

Figure 6A:
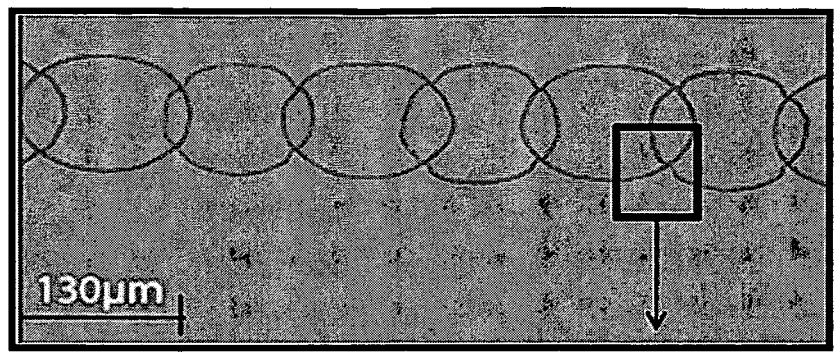
FIGS. 6A-C are light microscope images of a chain of rings (FIG. 6A)
Figure 6B:
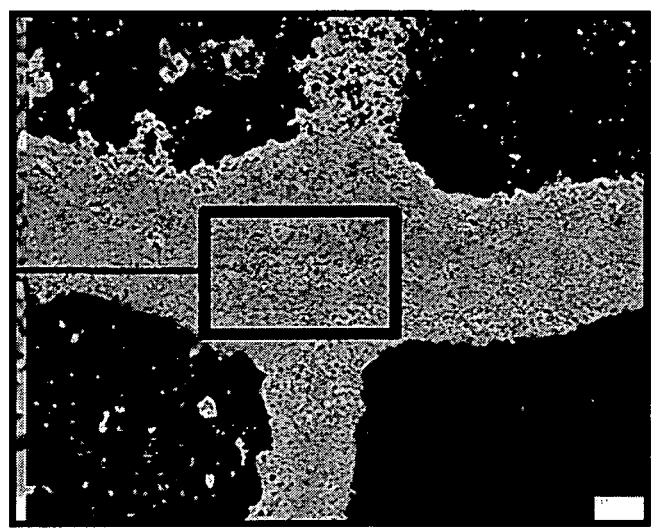
Figure 6C:
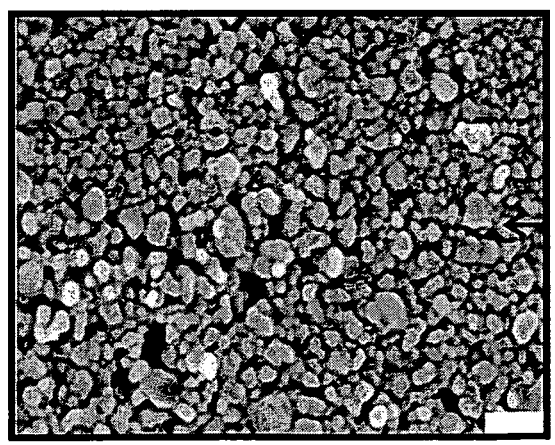

Chains composed of overlapping printed rings printed as described in Example 2, were obtained by printing a first forward line of rings with pre-determined spaces between the rings, followed by printing a backward, second line of rings, with a proper distance adjustment between the two lines. Optimization of the chain formation process was achieved by adjusting the jetting frequency (35 Hz) and the substrate movement (10000 micrometer/s). Part of such a chain is shown in FIGS. 6A-C.

Figure 7A:
FIG. 7 presents 40×40 $\mu m^2$ topographic image (FIG. 7A) and a corresponding current image measured with tip bias of 1 V (FIG. 7B). The current image range is 0-40 nA (the saturation current in the measurement was 40 nA).
Figure 7B:
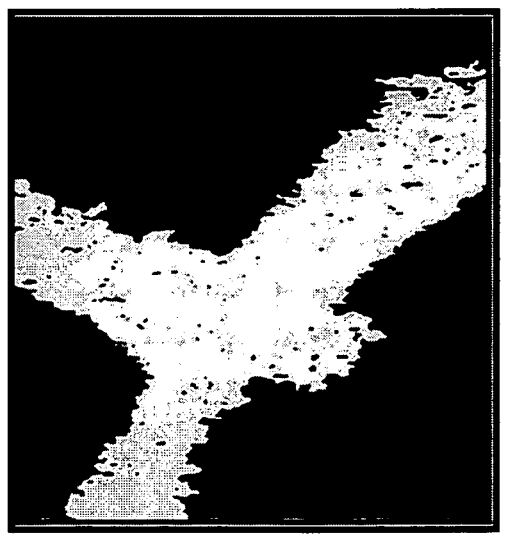

It should be noted that the deposition of one ring on top of another was previously reported to lead to the destruction of the first ring due to its re-dispersion [5]. However, by adjusting various ink and printing parameters such as concentration of silver nanoparticles in the ink, delay between line printing, and substrate temperature, close packing of the silver particles was achieved enabling, while dried, to overcome the possible re-dispersion of the pre-deposited rings. By controlling the positioning of the rings, continuous chains with fine contact between the rings were formed (FIG. 6B and FIG. 6C). Indeed, comparison between the topographic AFM image (FIG. 7A) and the current map image (FIG. 7B) of the same area (by C-AFM) reveal that the junction between the rings is not only geometrically continuous, but also has high electrical connectivity.

Resistance measurements performed for various chains composed of 4 to 20 connected rings revealed that the (average) resistivity is 5.1 (±0.5) 10-7 Ohm*m, which is close to the resistivity of an individual ring (described in Example 2), further demonstrating the high quality of the junctions between the rings. This resistivity was constant for at least three months at room temperature. It should be noted that this resistivity is much lower than that obtained by ITO, which is typically in the range of $10^{-6}$ Ohm*m.

Example 5

2-D Arrays

Figure 2:
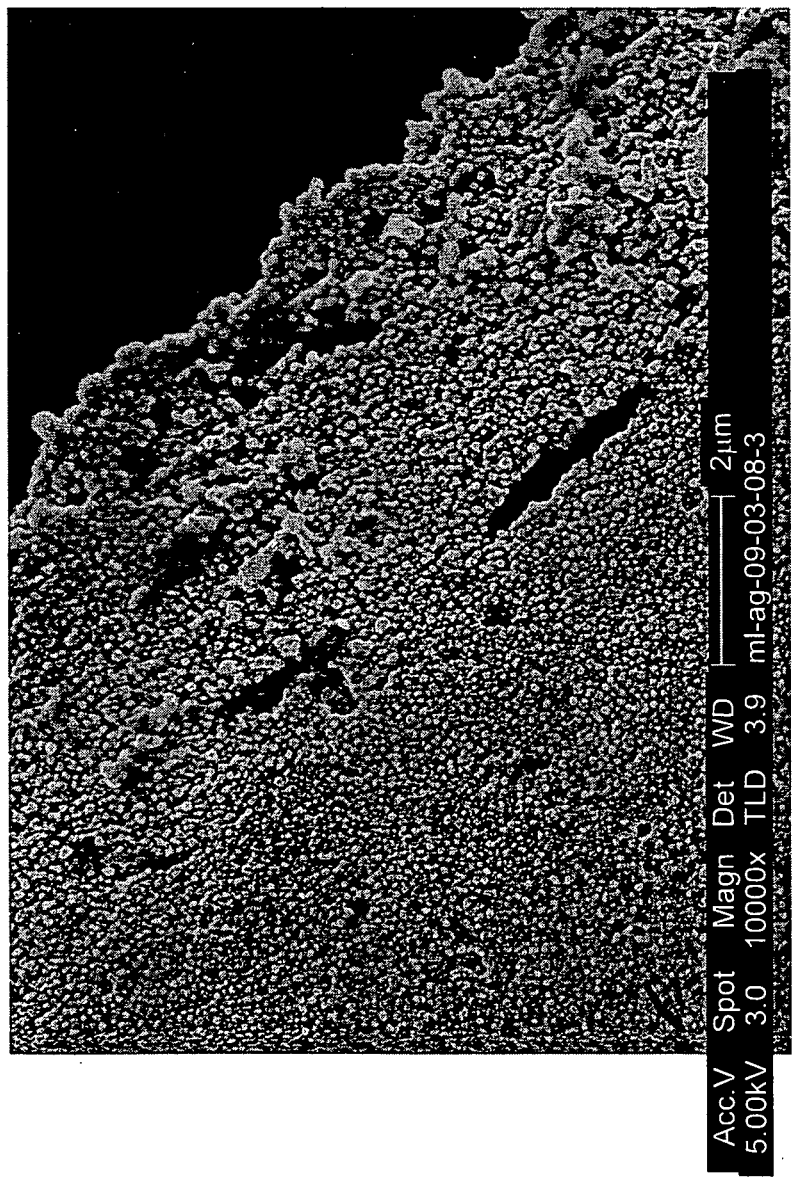
FIG. 2 presents a SEM image of the ring periphery composed of Ag and Cu nanoparticles on a Si substrate.
Figure 8A:
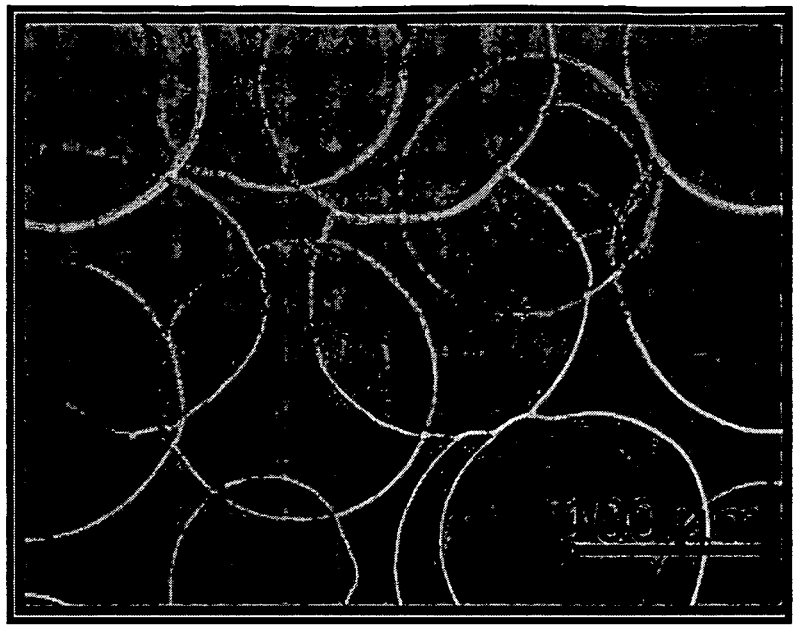
FIGS. 8A-B presents an array of interconnected rings in two different magnifications (FIGS. 8A and 8B).
Figure 8B:
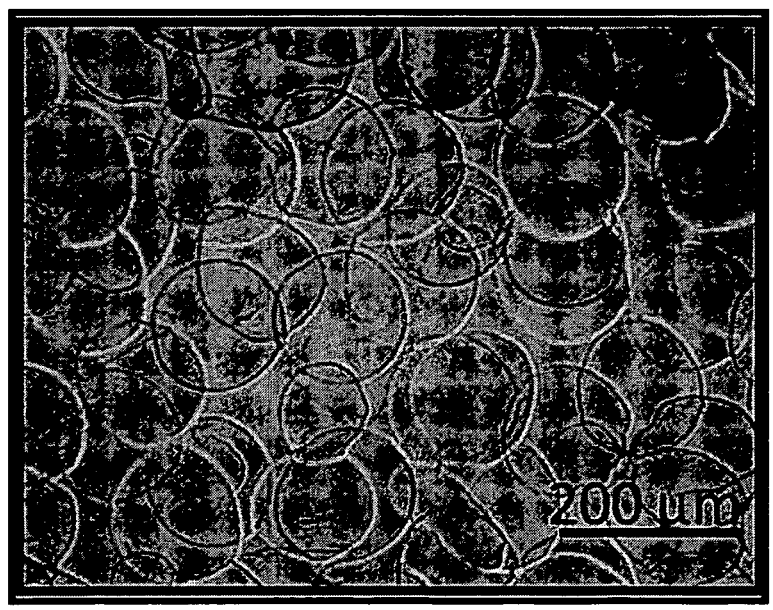

Two-dimensional (2-D) arrays of such rings were formed by repeating the chain formation procedure for a large number of lines, while keeping a constant distance between the lines. As shown in FIGS. 8A and 8B, 2-D arrays composed of connected chains could be obtained. The array is actually composed mainly of holes (the inner part of each ring), ~150 micrometer in diameter, which are connected by narrow lines, about 5 micrometer in width, located around each hole. The sheet resistance of such a 2-D array (sample area of 0.5 cm$^2$) was very low, 4±0.5 Ohm/square. It should be noted that qualitative bending experiments show that these values remained constant even after bending the substrate at angles below about 20°, showing that the arrays may be suitable for applications in which flexibility is required. For comparison, the typical sheet resistance of ITO thin films that have more than 80% transparency is much greater, in the range of 20-100 Ohm/square.

As may be realized, the 5 micrometer lines are almost invisible to the naked eye, thus the 2-D pattern is almost transparent. Quantitatively, the transmittance measured by a spectrophotometer at 400-800 nm was as great as 95(±3)% T.

Example 6

Electroluminescent Device

Figure 9A:
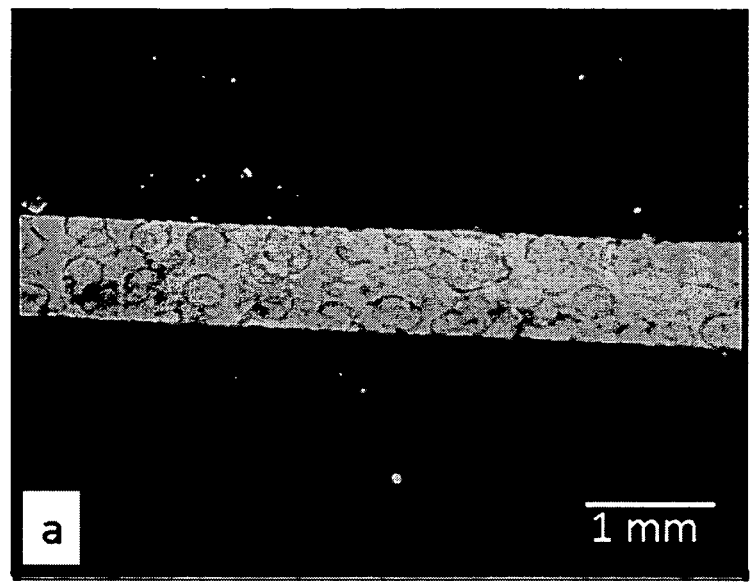
FIGS. 9A-B present the electro-luminescent glow from the rings in a 2 mm×1 cm device at various magnifications.
Figure 9B:
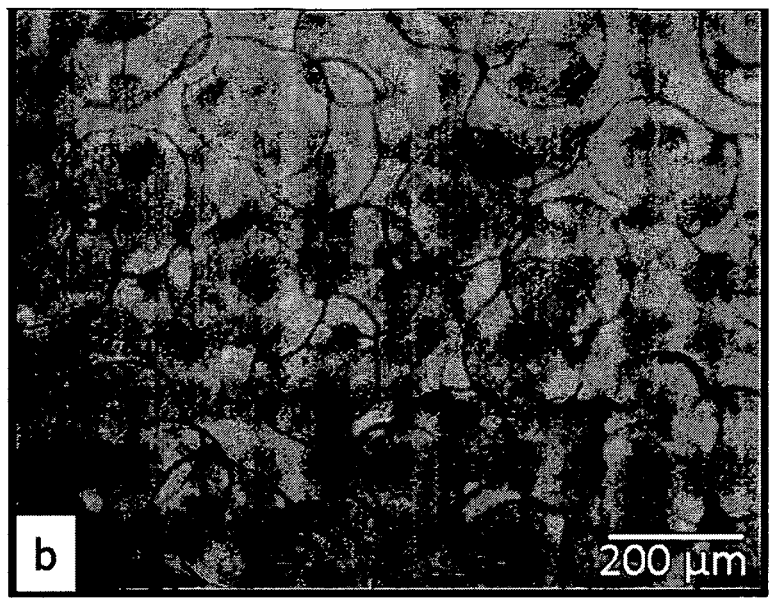

In order to further test these ring patterns as a transparent conductive oxide replacement, these conductive arrays were evaluated as the transparent electrode in an electroluminescent device. The device was fabricated on top of the transparent ring array by depositing layers of ZnS, and BaTiO$_3$ by conventional screen printing, followed by deposition of a second silver electrode. As demonstrated in FIG. 9A, for a 2 mm×1 cm device, the printed ring array is indeed conductive and transparent. As shown in FIG. 9B, in the areas in which the rings are connected there is a uniform light emission by the device (the decay length for emission was estimated to be about 20 μm).

The invention claimed is:

1. A process for the manufacture of a conductive transparent pattern on a substrate, the process comprising treating a substrate with a plurality of droplets of a conductive material, permitting said droplets to form an array of intersecting ring structures on the substrate, wherein the conductive material is selected from (1) a combination of one or more metals or precursors thereof, (2) a semiconductor material, (3) a carbon-based material, (4) quantum dots, and (5) any mixture of the aforementioned, to thereby obtain a conductive transparent pattern on the substrate, wherein the rim of each ring has a width of between 1 and 10 micron.

2. The process according to claim 1, wherein the droplets of the conductive material are delivered by inkjet.

3. The process according to claim 1, wherein the diameter of each of said ring structure is between about 100 and 200 microns.

4. The process according to claim 1, wherein the array of intersecting ring structures is of two or more conductive materials.

5. A process for the manufacture of a conductive transparent pattern on a substrate, the process comprising treating a substrate with a plurality of droplets of a conductive material, permitting each of said droplets to form a ring structure and intersect with another ring structure to thereby form an array of intersecting ring structures on the substrate, wherein the conductive material is selected from (1) a combination of one or more metals or precursors thereof, (2) a semiconductor material, (3) a carbon-based material, (4) quantum dots, and (5) any mixture of the aforementioned, to thereby obtain a conductive transparent pattern on the substrate, wherein the rim of each ring has a width of between 1 and 10 micron.

6. The process according to claim 5, wherein the droplets of the conductive material are delivered by inkjet.

7. The process according to claim 5, wherein the diameter of each of said ring structure is between about 100 and 200 microns.

8. The process according to claim 5, wherein the array of intersecting ring structures is of two or more conductive materials.

* * * * *